United States Patent
Yano et al.

(10) Patent No.: US 12,544,709 B2
(45) Date of Patent: Feb. 10, 2026

(54) VENTILATION COMPONENT

(71) Applicant: NITTO DENKO CORPORATION, Ibaraki (JP)

(72) Inventors: Youzou Yano, Osaka (JP); Tomoyuki Kasagi, Osaka (JP); Takumi Takahashi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 749 days.

(21) Appl. No.: 17/792,633

(22) PCT Filed: Jan. 14, 2021

(86) PCT No.: PCT/JP2021/001071
§ 371 (c)(1),
(2) Date: Jul. 13, 2022

(87) PCT Pub. No.: WO2021/145383
PCT Pub. Date: Jul. 22, 2021

(65) Prior Publication Data
US 2023/0043612 A1 Feb. 9, 2023

(30) Foreign Application Priority Data
Jan. 14, 2020 (JP) .................................. 2020-003851

(51) Int. Cl.
*B01D 53/00* (2006.01)
*B01D 53/22* (2006.01)
*H05K 5/02* (2006.01)

(52) U.S. Cl.
CPC ........... *B01D 53/22* (2013.01); *H05K 5/0213* (2013.01)

(58) Field of Classification Search
CPC .... B01D 53/22; H05K 5/0213; H05K 5/0216; H05K 5/068; F21S 45/30; F21V 31/03; F16K 24/00
(Continued)

(56) References Cited

U.S. PATENT DOCUMENTS 4,765,499 A * 8/1988 von Reis ............. B65D 51/1616
215/261
5,515,994 A * 5/1996 Goglio ................ B65D 51/1644
220/372
(Continued)

FOREIGN PATENT DOCUMENTS

CN 110573777 A 12/2019
EP 2783844 A1 10/2014
(Continued)

OTHER PUBLICATIONS

International Search Report and Written Opinion issued for International Patent Application No. PCT/JP2021/001071, Date of mailing: Mar. 30, 2021, 13 pages including English translation.
(Continued)

*Primary Examiner* — T. Bennett Mckenzie
(74) *Attorney, Agent, or Firm* — HSML P.C.

(57) ABSTRACT

A ventilation component 1a includes an internal member 10, a gas-permeable membrane 20, and an external member 30. The internal member 10 has an open tubular structure, and has a protruding portion 11 on an outer circumferential surface of the open tubular structure. The gas-permeable membrane 20 covers one opening of the internal member 10. The external member 10 is formed to have a closed tubular structure and has a hooking portion on an inner circumferential surface of the closed tubular structure, the hooking portion hooking the protruding portion. The internal member 10 is fixed to the external member 30 in a state where the internal member 10 is inserted inside the external member
(Continued)

30 and the external member 30 hooks the protruding portion 11 by the hooking portion 33. The ventilation component 1a is capable of being fixed to a projection 2p tubularly protruding from an outer surface of a housing 2. When the internal member 10 and the external member 30 are viewed in plan along an axis A, the ventilation component 1a satisfies a requirement $I_H < O_B < O_O$.

5 Claims, 5 Drawing Sheets

(58) Field of Classification Search
USPC .............................................. 96/4; 55/385.4
See application file for complete search history.

(56) References Cited

U.S. PATENT DOCUMENTS

| | | | |
|---|---|---|---|
| 5,914,415 | A | 6/1999 | Tago |
| 6,364,924 | B1 | 4/2002 | Mashiko et al. |
| 6,983,857 | B2 * | 1/2006 | Miller .................. B65D 51/165 215/349 |
| 2002/0190485 | A1 | 12/2002 | Ohyama et al. |
| 2003/0216119 | A1 * | 11/2003 | Mashiko ................ F21S 45/33 454/275 |
| 2016/0174397 | A1 * | 6/2016 | Ishii ....................... F21V 31/03 55/385.4 |
| 2017/0271092 | A1 * | 9/2017 | Ishii ....................... H01G 11/14 |
| 2018/0163944 | A1 | 6/2018 | Kim et al. |
| 2018/0356065 | A1 | 12/2018 | Yano |
| 2019/0389363 | A1 | 12/2019 | Kim |
| 2020/0340592 | A1 | 10/2020 | Nakayama et al. |
| 2020/0384673 | A1 | 12/2020 | Kitagawa et al. |
| 2021/0302005 | A1 * | 9/2021 | Lee ........................ F21S 45/50 |

FOREIGN PATENT DOCUMENTS

| | | |
|---|---|---|
| EP | 2916067 A1 | 9/2015 |
| JP | H1085536 A | 4/1998 |
| JP | 2001143524 A | 5/2001 |
| JP | 2003336874 | 11/2003 |
| JP | 2015033682 | 2/2015 |
| JP | 2017111916 | 6/2017 |
| JP | 2018098184 | 6/2018 |
| WO | 2010076326 A1 | 7/2010 |
| WO | 2019111881 | 6/2019 |

OTHER PUBLICATIONS

The First Office Action issued for Chinese Patent Application No. 202180008447.1, dated Dec. 29, 2023, 9 pages including English machine translation.
Notice of Final Rejection issued for Korean Patent Application No. 10-2022-7027642, Dispatched date: Oct. 11, 2024, 5 pages including English machine translation.
Written Decision on Dismissal of Amendment issued for Korean Patent Application No. 10-2022-7027642, Dispatched date: Oct. 11, 2024, 6 pages including English machine translation.
Notice of Final Rejection issued for Korean Patent Application No. 10-2022-7027642, Dispatched Date: Jun. 26, 2024, 8 pages including English machine translation.
Extended European Search Report issued for European Patent Application No. 21741250.1, dated Dec. 12, 2023, 8 pages.
Office Action issued for Indian Patent Application No. 202217045101, Date of Dispatch: Nov. 4, 2025, 6 pages.
Request for the Submission of an Opinion issued for Korean Patent Application No. 10-2025-7000966, Dispatched date: Dec. 18, 2025, 14 pages including English machine translation.

* cited by examiner

VENTILATION COMPONENT

TECHNICAL FIELD

The present invention relates to a ventilation component.

BACKGROUND ART

Ventilation components are sometimes fixed to housings of in-vehicle electrical components such as lamps, inverters, converters, electronic control units (ECUs), battery packs, radars, and cameras and a variety of electronic devices for home use, medical use, office use, etc. For example, ventilation components can sometimes be fixed to a housing, for example, to ensure ventilation between the inside and the outside of the housing or to reduce pressure variation inside the housing. Ventilation components to be fixed to a housing are required to have, in addition to ventilation properties, various properties such as dust proofness for preventing entry of dust into the housing, water proofness for preventing entry of water into the housing, oil proofness for preventing entry of oil into the housing, and CCT resistance for preventing entry of salt into the housing depending on a specific use of the housing.

For example, Patent Literature 1 describes a ventilation member fitted to a neck portion of a housing to fix the ventilation member to the housing (refer to FIG. 14). This ventilation member includes a cover component, a substantially tubular body, and a filter. The substantially tubular body is fitted in the cover component. An opening at a bottom portion of the substantially tubular body is covered by the filter. A ventilation path is arranged between an inner circumference of the cover component and an outer circumference of the substantially tubular body and between a bottom face of the cover component and the bottom portion of the substantially tubular body.

CITATION LIST

Patent Literature

Patent Literature 1: JP 2003-336874 A

SUMMARY OF INVENTION

Technical Problem

The ventilation member described in Patent Literature 1 leaves room for reconsideration in view of eliminating a disadvantage associated with deformation of the substantially tubular body caused to deform at the time of fixing the ventilation member to a projection such as a neck portion of a housing. Therefore, the present invention provides a ventilation component that is advantageous in eliminating a disadvantage associated with deformation of a member of the ventilation component, the member being caused to deform by a projection of a housing at the time of fixing the ventilation component to the projection of the housing.

Solution to Problem

The present invention provides a ventilation component including:
- an internal member including an elastic material, having an open tubular structure, and having a protruding portion protruding outward from an outer circumferential surface of the open tubular structure;
- a gas-permeable membrane covering one opening of the internal member; and
- an external member having a closed tubular structure and having a hooking portion on an inner circumferential surface of the closed tubular structure, the hooking portion hooking the protruding portion, wherein the internal member is fixed to the external member in a state where the internal member is inserted inside the external member and the external member hooks the protruding portion by the hooking portion, the ventilation component is capable of being fixed to a projection of a housing in a state where the projection is inserted inside the internal member through the other opening of the internal member and an inner circumferential surface of the internal member and an outer circumferential surface of the projection abut each other, the projection tubularly protruding from an outer surface of the housing toward an edge of a ventilation opening allowing communication between an inner space and an outer space of the housing, in a state where the ventilation component is fixed to the projection, a gas passes through the gas-permeable membrane for ventilation between the inner space and the outer space of the housing, and when the internal member and the external member are viewed in plan along an axis of the ventilation component, an outer diameter $O_B$ of the protruding portion, an inner diameter $I_H$ of the hooking portion, and an inner diameter $O_O$ of a portion of the external member satisfy a requirement $I_H<O_B<O_O$, the portion facing the protruding portion.

Advantageous Effects of Invention

The above ventilation component is advantageous in eliminating a disadvantage associated with deformation of the internal member caused to deform by the projection of the housing at the time of fixing the ventilation component to the projection of the housing.

DESCRIPTION OF EMBODIMENTS

It has been thought desirable that in a ventilation component capable of being attached to a tubular projection of a housing by fitting an internal member having an open tubular structure into an external member having a closed tubular structure, an outer circumferential surface of the open tubular structure of the internal member and an inner circumferential surface of the closed tubular structure of the external member are in contact with each other in a state where the internal member is elastically deformed. The reason is that such a configuration is thought to prevent detachment of the internal member and the external member and make handling of the ventilation component easy at the time of attaching the ventilation component to the tubular projection of the housing. However, studies by the present inventors have newly revealed that in the case where the outer circumferential surface of the open tubular structure of the internal member and the inner circumferential surface of the closed tubular structure of the external member are in contact with each other in a state where the internal member is elastically deformed, a disadvantage associated with the deformation of the internal member occurs at the time of fixing the ventilation component to the tubular projection of the housing. For example, the following disadvantages can arise: a need for a large force to insert the tubular projection of the housing into the internal member; and a narrow ventilation path arranged between the outer circumferential surface of the open tubular structure of the internal member and the inner circumferential surface of the closed tubular structure of the external member. Therefore, the present inventors have made intensive studies to eliminate the above disadvantage and invented the ventilation component according to the present invention.

Hereinafter, embodiments of the present invention will be described with reference to the drawings. The following description describes examples of the present invention, and the present invention is not limited to the following embodiments.

Figure 1A:
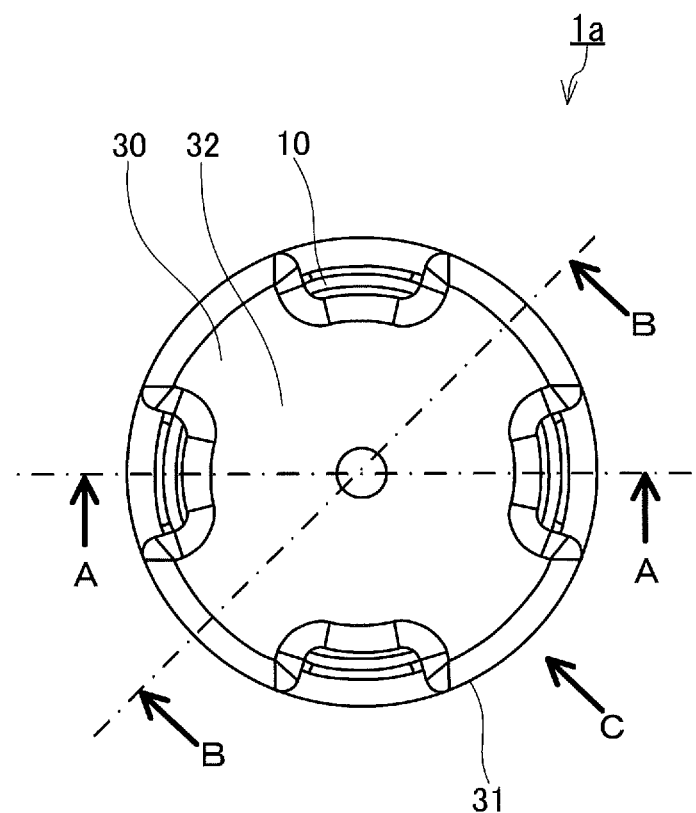
FIG. 1A is a plan view showing an example of a ventilation component according to the present invention.
Figure 2A:
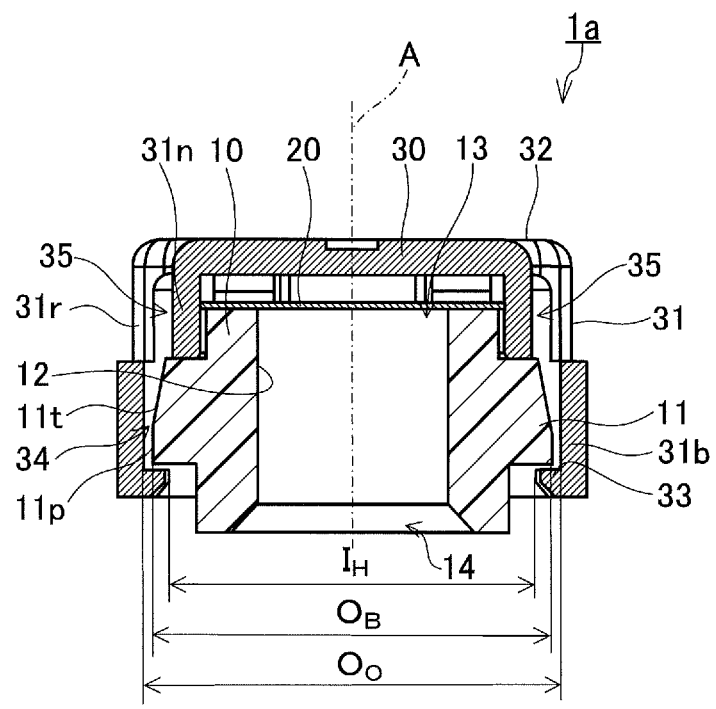
FIG. 2A is a cross-sectional view showing the ventilation component along a line A-A of FIG. 1A.

As shown in FIGS. 1A and 2A, a ventilation component $1a$ includes an internal member 10, a gas-permeable membrane 20, and an external member 30. The internal member 10 includes an elastic material. Additionally, the internal member 10 has an open tubular structure. In other words, the internal member 10 is formed in the shape of a tube having an opening at each end thereof. The internal member 10 has a protruding portion 11. The protruding portion 11 protrudes outward from an outer circumferential surface of the open tubular structure. In other words, the protruding portion 11 protrudes outward in a direction perpendicular to an axis of the internal member 10. The gas-permeable membrane 20 covers one opening 13 of the internal member 10. The external member 30 has a closed tubular structure. In other words, the external member 30 is formed in the shape of a tube having an opening at only one of two ends. The external member 30 has a hooking portion 33 on an inner circumferential surface of the closed tubular structure. The hooking portion 33 hooks the protruding portion 11. As shown in FIG. 2A, in the ventilation component $1a$, the internal member 10 is fixed to the external member 30 in a state where the internal member 10 is inserted inside the external member 30 and the external member 30 hooks to the protruding portion 11 by the hooking portion 33.

Figure 4:
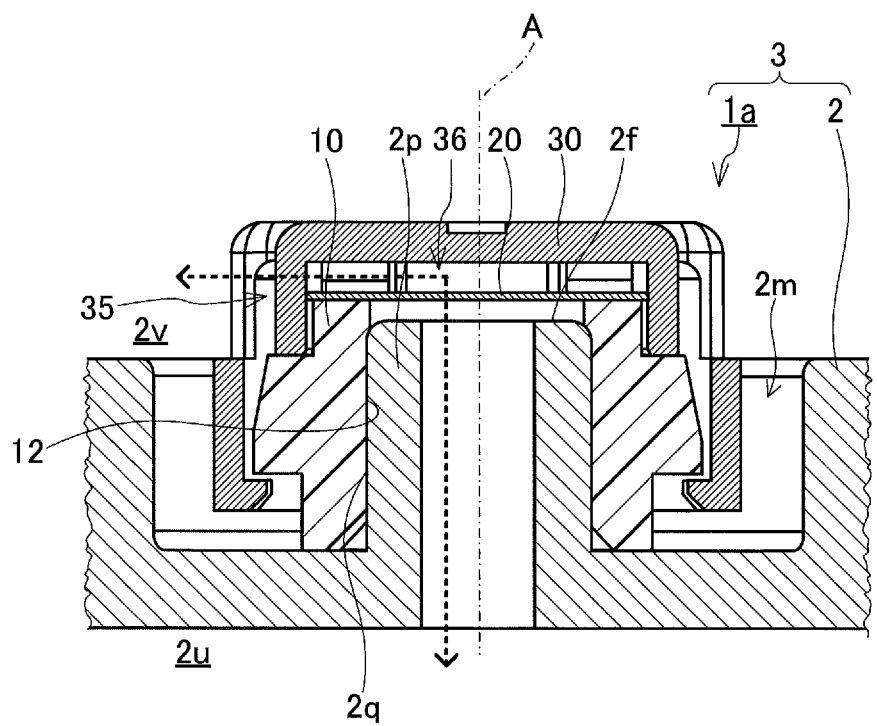
FIG. 4 is a cross-sectional view of an example of a ventilation structure including the ventilation component shown in FIG. 1A.

As shown in FIG. 4, the ventilation component $1a$ can be fixed to a projection $2p$ of a housing 2 in a specific state. The projection $2p$ tubularly protrudes from an outer surface of the housing 2 toward an edge $2f$ of a ventilation opening allowing communication between an inner space $2u$ and an outer space $2v$ of the housing 2. The specific state refers to a state where the projection $2p$ is inserted inside the internal member 10 through the other opening 14 of the internal member 10 and an inner circumferential surface 12 of the internal member 10 and an outer circumferential surface $2q$ of the projection $2p$ abut each other. In a state where the ventilation component $1a$ is fixed to the projection $2p$, a gas passes through the gas-permeable membrane 20 for ventilation between the inner space $2u$ and the outer space $2v$ of the housing 2.

As shown in FIG. 2A, when the internal member 10 and the external member 30 are viewed in plan along an axis A of the ventilation component $1a$, an outer diameter $O_B$ of the protruding portion 11, an inner diameter $I_H$ of the hooking portion 33, and an inner diameter $O_O$ of a portion $31b$ of the external member 30 satisfy a requirement $I_H < O_B < O_O$, the portion $31b$ facing the protruding portion 11. As the requirement $I_H < O_B$ is satisfied in the ventilation component $1a$, the external member 30 can more reliably hooks the protruding portion 11 by the hooking portion 33. Meanwhile, as the requirement $O_B < O_O$ is satisfied in the ventilation component $1a$, a given gap 34 is provided between the protruding portion 11 and the inner circumferential surface of the external member 30, the inner circumferential surface facing the protruding portion 11. For example, the projection $2p$ is inserted inside the internal member 10 to fix the ventilation component $1a$ to the projection $2p$. At this time, because the internal member 10 includes the elastic material, the internal member 10 is deformed by the projection $2p$ to have an increased inner diameter. This deformation induces an increase in an outer diameter of the internal member 10 too. If $O_B = O_O$ is satisfied, the internal member 10 is subjected to a large compressive stress between the projection $2p$ and the external member 30. Consequently, a large force is needed to insert the projection $2p$ inside the internal member 10. However, since the requirement $O_B < O_O$ is satisfied in the ventilation component $1a$ and the gap 34 is provided thereto, a portion of the internal member 10 deformed to insert the projection $2p$ inside the internal member 10 can be allowed to be in the gap 34. Consequently, the internal member 10 is not likely to be subjected to a large compressive stress between the projection $2p$ and the external member 30, and a force needed to insert the projection $2p$ inside the internal member 10 is easily decreased. The ventilation component $1a$ is also advantageous in that only the internal member 10 needs to be taken into account in adjustment of a force needed to insert the projection $2p$ inside the internal member 10.

As long as the requirement $I_H < O_B < O_O$ is satisfied in the ventilation component $1a$, values of $I_H$, $O_B$, and $O_O$ are not limited to particular values. The value of $O_O - O_B$ is, for example, 0.1 mm or more and 1.0 mm or less. This more reliably eliminates the disadvantage associated with deformation of the internal member 10 caused to deform at the time of fixing the ventilation component $1a$ to the tubular projection $2p$ of the housing 2.

The value of $O_O - O_B$ may be 0.2 mm or more or 0.3 mm or more. The value of $O_O - O_B$ may be 0.9 mm or less or 0.8 mm or less.

The value of $O_B - I_H$ is, for example, 0.6 mm or more and 2.4 mm or less. The value of $O_B - I_H$ may be 0.7 mm or more or 0.8 mm or more. The value of $O_B - I_H$ may be 2.3 mm or less or 2.2 mm or less.

The value of $O_B$ is, for example, 5.0 mm or more and 20 mm or less. The value of $O_B$ may be 6.0 mm or more or 7.0 mm or more. The value of $O_B$ may be 19 mm or less or 18 mm or less.

As shown in FIG. 2A, the closed tubular structure of the external member 30 has a side wall 31 and a bottom wall 32. The side wall 31 extends along the axis A. The bottom wall 32 extends in a direction perpendicular to the axis A. The bottom wall 32 and the side wall 31 meet to form a corner.

The gas-permeable membrane 20 is typically covered by the bottom wall 32. The bottom wall 32 is, for example, placed apart from the gas-permeable membrane 20 in an axial direction of the ventilation component 1a. Consequently, a space 36 is arranged between the bottom wall 32 and the gas-permeable membrane 20. A gas passes through the space 36 for ventilation.

Figure 1B:
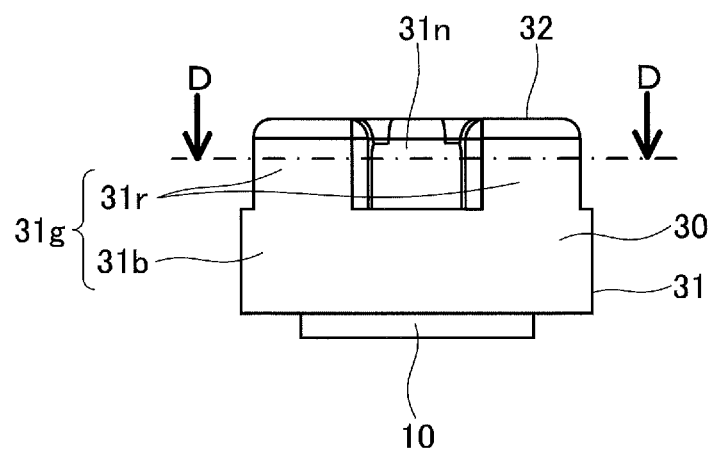
FIG. 1B is a side view of the ventilation component shown in FIG. 1A.
Figure 1C:
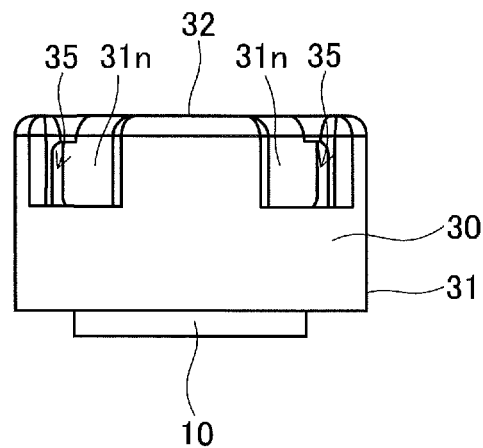
FIG. 1C is a side view of the ventilation component viewed in the direction indicated by an arrow C shown in FIG. 1A.
Figure 1D:
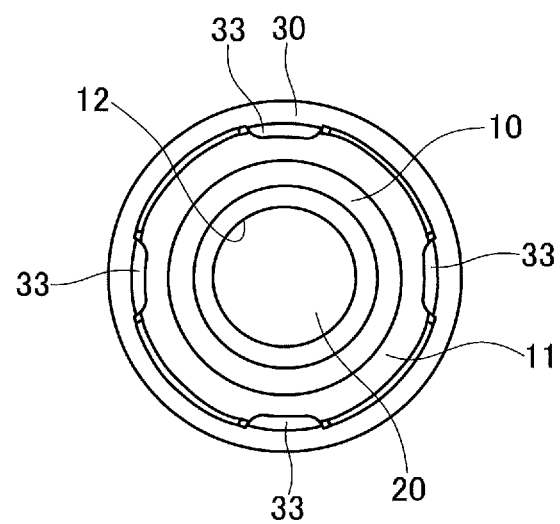
FIG. 1D is another plan view of the ventilation component shown in FIG. 1A.
Figure 2B:
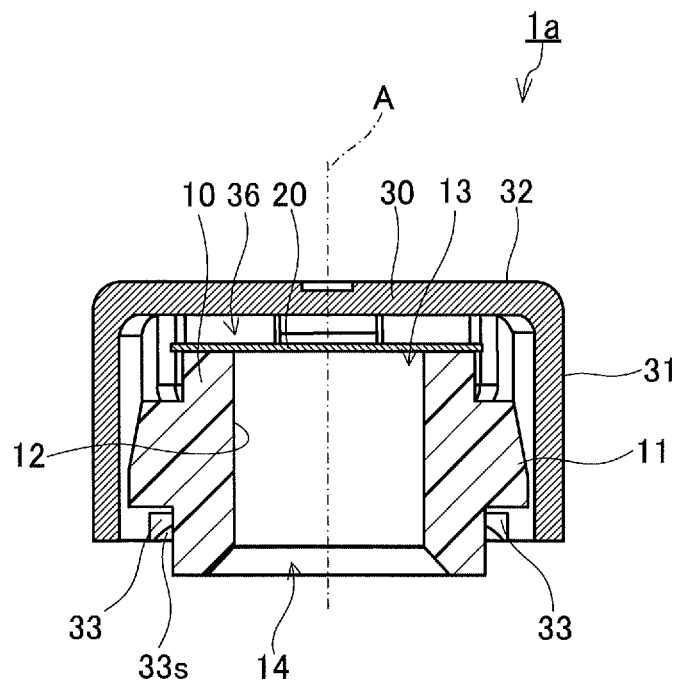
FIG. 2B is a cross-sectional view of the ventilation component along a line B-B of FIG. 1A.
Figure 3:
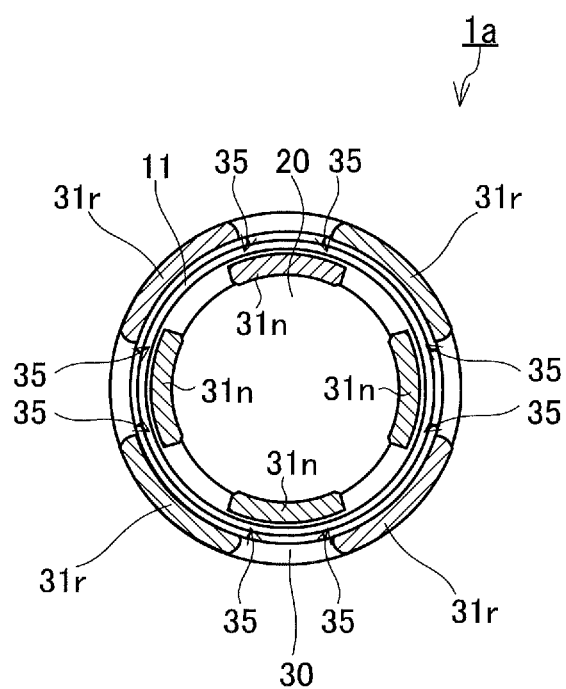
FIG. 3 is a cross-sectional view of the ventilation component along a line D-D of FIG. 1B.

As shown in FIGS. 1D and 3, the protruding portion 11 extends along an entire outer circumference of the open tubular structure of the internal member 10. The protruding portion 11 is arranged, for example, in a ring shape. According to this configuration, the external member 30 can hook the protruding portion 11 by the hooking portion 33 regardless of how the internal member 10 is placed around the axis A. On the other hand, as shown in FIGS. 1C and 2B, the ventilation component 1a has, for example, a ventilation hole 35. The ventilation hole 35 is formed to penetrate the side wall 31. In other words, the ventilation hole 35 connects an inner circumferential surface of the side wall 31 and an outer circumferential surface of the side wall 31. The ventilation hole 35 is arranged closer to the bottom wall 32 than the protruding portion 11 in the axial direction of the ventilation component 1a. This configuration allows ventilation through the ventilation hole 35 even when a ventilation path arranged between the outer circumferential surface of the internal member 10 and the inner circumferential surface of the external member 30 is not wide.

The ventilation hole 35 may be formed, for example, to penetrate the bottom wall 32. In other words, the ventilation hole 35 may be formed such that the ventilation hole 35 connects an inner circumferential surface of the bottom wall 32 and an outer circumferential surface of the bottom wall 32. The ventilation hole 35 may be formed, for example, to penetrate the side wall 31 and the bottom wall 32. In other words, the ventilation hole 35 may be formed such that the ventilation hole 35 connects the inner circumferential surface of the side wall 31 and the outer circumferential surface of the bottom wall 32, or may be formed such that the ventilation hole 35 connects the inner circumferential surface of the bottom wall 32 and the outer circumferential surface of the side wall 31. The ventilation hole 35 may be formed as a through hole or may be formed as a slit.

As shown in FIG. 1C, the ventilation hole 35 is arranged, for example, at least one of the internal member 10 and the gas-permeable membrane 20 is visually unrecognizable through the ventilation hole 35. In other words, the ventilation hole 35 is arranged such that at least one of the internal member 10 and the gas-permeable membrane 20 is visually unrecognizable when the inside of the external member 30 is viewed from the outside of the external member 30 through the ventilation hole 35. In this case, for example, the inside of the external member 30 is observed in a direction perpendicular to an opening of the ventilation hole 35, the opening being in contact with the outer circumferential surface of the external member 30. Even if a foreign matter from the outside of the external member 30 passes through the ventilation hole 35, this configuration makes it easy to prevent the foreign matter from damaging at least one of the internal member 10 and the gas-permeable membrane 20.

As shown in FIGS. 1B and 3, the side wall 31 has, for example, an outer side wall 31g and an inner side wall 31n. The outer side wall 31g includes, for example, the portion 31b of the external member 30 and a plurality of ribs 31r, the portion 31b facing the protruding portion 11. The plurality of ribs 31r are placed around the axis A at given intervals between, in the axial direction, the portion 31b and the bottom wall 32. The plurality of ribs 31r are typically placed around the axis A at regular intervals. The inner side wall 31n is placed closer to the axis A than the outer side wall 31g in the direction perpendicular to the axis A. The inner side wall 31n is arranged between, in the axial direction, the portion 31b and the bottom wall 32. As shown in FIG. 2A, an end of the inner side wall 31n in the axial direction faces, for example, the protruding portion 11 of the internal member 10. For example, the inner side wall 31n determines the positions of the internal member 10 and the external member 30 in the axial direction. The distance between the bottom wall 32 and the gas-permeable membrane 20 can be adjusted thereby to a desirable value.

The side wall 31 has, for example, a plurality of the inner side walls 31n, and the plurality of inner side walls 31n are placed around the axis A at given intervals. The plurality of inner side walls 31n are typically placed around the axis A at regular intervals. The plurality of ribs 31r and the plurality of inner side walls 31n are, for example, alternately placed around the axis A. Consequently, the external member 30 has recesses arranged around the axis A at given intervals, as shown in FIG. 1A. For example, around the axis A, an end portion of the rib 31r overlaps an end portion of the inner side wall 31n. Consequently, a gap space between the end portion of the rib 31r and the end portion of the inner side wall 31n around the axis A forms the ventilation hole 35. This configuration allows the side wall 31 to appropriately protect the internal member 10 and the gas-permeable membrane 20 and makes it easy to form a wide ventilation hole 35.

As shown in FIG. 2A, the hooking portion 33 protrudes, for example, toward the axis A in the direction perpendicular to the axis A. As shown in FIG. 1D, the external member 30 has, for example, a plurality of the hooking portions 33. The plurality of hooking portions 33 are, for example, placed around the axis A at given intervals. The plurality of hooking portions 33 are, for example, placed around the axis A at regular intervals. The hooking portion 33 may be arranged, for example, in a ring shape on the inner circumferential surface of the closed tubular structure of the external member 30. In the case where the external member 30 has the plurality of hooking portions 33 placed around the axis A at given intervals, the inner diameter $I_H$ of the hooking portion 33 may be determined as the diameter of a circle inscribed in the plurality of hooking portions 33 when the external member 30 is viewed in plan along the axis A.

As shown in FIG. 2B, the hooking portion 33 has, for example, a slope 33s. The distance between the slope 33s and the outer circumferential surface of the internal member 10 at a particular position in the axial direction is greater than the distance between the slope 33s and the outer circumferential surface of the internal member 10 at a position, in the axial direction, closer to the protruding portion 11 than the particular position. This configuration is likely to decrease a friction force between the protruding portion 11 and the hooking portion 33 at the time of attaching the internal member 10 to the inside of the external member 30. Therefore, the internal member 10 is easily attached to the inside of the external member 30.

As shown in FIG. 2A, an end surface of the protruding portion 11 in the direction perpendicular to the axis A has, for example, a taper face 11t and a pillar face 11p. The diameter of the protruding portion 11 at the pillar face 11p can correspond, for example, to the outer diameter $O_B$. The pillar face 11p is arranged closer to the other opening 14 than the taper face 11t. The diameter of the taper face 11t decreases toward the one opening 13. A ratio (Lt/Lz) of a length Lt of a portion forming the taper face 11*t* to a whole length Lz of the protruding portion 11 in the axial direction is, for example, 0.2 to 0.8. For example, the internal member 10 is attached to the inside of the external member 30 by relatively moving the internal member 10 and the external member 30 so that the distance between the external member 30 and the internal member 10 in the axial direction will decrease. At this time, a portion near the hooking portion 33 of the external member 30 deforms outward in the direction perpendicular to the axis A. The ratio Lt/Lz in the above range makes it unlikely that the amount of deformation of the portion near the hooking portion 33 varies rapidly in the attachment of the internal member 10 to the inside of the external member 30. Therefore, the internal member 10 is easily attached to the inside of the external member 30. Moreover, the ratio Lt/Lz in the above range is likely to shorten the length of the pillar face 11*p* in the axial direction, and thus a duration in which the amount of deformation of the portion near the hooking portion 33 is maximum is easily shortened in the attachment of the internal member 10 to the inside of the external member 30.

The elastic material included in the internal member 10 is not limited to a particular elastic material. The elastic material is, for example, an elastomer (elastic resin). The elastomer may be a rubber. Examples of the elastomer include nitrile rubber (NBR), ethylene-propylene rubber (EPDM), silicone rubber, fluorine rubber, acrylic rubber, hydrogenated rubber, and various thermoplastic elastomers.

The material of the external member 30 is not limited to a particular material. The material of the external member 30 is, for example, a resin. The resin is, for example, a thermoplastic resin or the above-described elastomer. Examples of the thermoplastic resin include polyamide (PA) such as nylon, polybutylene terephthalate (PBT), polyethylene terephthalate (PET), polyphenylene sulfide (PPS), polycarbonate (PC), polypropylene (PP), and polyphenylene ether (PPE). The material of the external member 30 may be a material same as the elastic material included in the internal member 10 or may be a material different from the elastic material included in the internal member 10.

The resins included in the internal member 10 and the external member 30 may include an additive such as: a pigment such as carbon black or titanium white; a reinforcing filler such as glass particles and glass fibers; or a water-repellent agent.

The gas-permeable membrane 20 is not limited to a particular gas-permeable membrane as long as the gas-permeable membrane 20 has desirable gas permeability. The gas-permeable membrane 20 may be a single layer membrane, or may be a multilayer membrane. In the case where the gas-permeable membrane 20 is a multilayer membrane, each layer thereof can be formed of one selected from the group consisting of a porous membrane, a nonwoven fabric, a cloth, and a mesh. The gas-permeable membrane 20 may include: a porous membrane and a nonwoven fabric; a porous membrane and at least one of a cloth and a mesh; or a plurality of nonwoven fabrics. Typically, the gas-permeable membrane 20 is composed of an organic polymer material (resin). The material of the porous membrane is, for example, a fluorine resin. As the fluorine resin can be used, for example, polytetrafluoroethylene (PTFE), polychlorotrifluoroethylene, a tetrafluoroethylene-hexafluoropropylene copolymer, or a tetrafluoroethylene-ethylene copolymer. The material of the porous membrane may be a polyolefin, such as a homopolymer or copolymer of a monomer(s) such as ethylene, propylene, or 4-methylpentene-1,1-butene. The porous membrane may be a porous nanofiber membrane made of, for example, polyacrylonitrile, nylon, or polylactic acid. The porous membrane can be manufactured by a known drawing or extraction technique. Examples of the materials of the nonwoven fabric, the cloth, and the mesh include polyesters such as polyethylene terephthalate, polyolefins such as polyethylene and polypropylene, nylon, aramids, and ethylene-vinyl acetate copolymer.

The gas-permeable membrane 20 desirably includes a PTFE porous membrane. The PTFE porous membrane can ensure gas permeability with a small area and can effectively prevent entry of a foreign matter. The PTFE porous membrane may be layered on a gas-permeable supporting member such as a nonwoven fabric.

The thickness of the gas-permeable membrane 20 is not limited to a particular thickness. The thickness of the gas-permeable membrane 20 is, for example, 1 μm or more and 5 mm or less. The gas permeation rate of the gas-permeable membrane 20 is 0.1 to 300 sec/100 mL, for example, when measured according to Method B (Gurley method) of gas permeability measurement specified in Japanese Industrial Standards JIS L 1096.

The gas-permeable membrane 20 may be subject to a liquid-repellant treatment as necessary. The liquid-repellant treatment is performed, for example, by forming a liquid-repellant coating film containing a fluorine surface modifier having a perfluoroalkyl group on the gas-permeable membrane 20. The method for forming the liquid-repellant coating film is not limited to a particular formation method. The liquid-repellant coating film is formed, for example, by coating a porous resin membrane with a solution or dispersion of a fluorine surface modifier having a perfluoroalkyl group by a method such as air spraying, electrostatic spraying, dip coating, spin coating, roll coating, curtain flow coating, or impregnation. The liquid-repellant coating film may be formed by electrodeposition or plasma polymerization.

A surface of at least one of the internal member 10 and the external member 30 may have at least partially been subjected to the liquid-repellent treatment. The liquid-repellent treatment can be performed, for example, by forming a coating film by any of the methods described above as the liquid-repellent treatment method for the gas-permeable membrane 20, electrodeposition coating, or plasma polymerization.

The gas-permeable membrane 20 is, for example, adhered to an end face of the internal member 10 in the axial direction. The gas-permeable membrane 20 may be welded to the end face. The available welding method can be thermal welding, ultrasonic welding, and laser welding. Alternately, at the time of molding the internal member 10, the gas-permeable membrane 20 may be attached to the end face by insert molding, specifically, by pouring a resin in a mold for molding the internal member 10 with the gas-permeable membrane 20 placed at a given position in the mold. The gas-permeable membrane 20 may be attached to the end face with a double-sided adhesive tape.

For example, a ventilation structure 3 shown in FIG. 4 can be provided using the ventilation component 1*a*. The ventilation structure 3 includes the ventilation component 1*a* and the housing 2. The housing 2 has the tubular projection 2*p* on the outer circumferential surface thereof, and the ventilation component 1*a* is fixed to the projection 2*p*. Specifically, the ventilation component 1*a* is fixed to the projection 2*p* in the specific state where the projection 2*p* is inserted inside the internal member 10 through the other opening 14 of the internal member 10 and the inner circumferential surface 12 of the internal member 10 and the outer circumferential surface 2q of the projection 2p abut each other. The inner diameter of the open tubular structure of the internal member 10 is smaller than the outer diameter of the projection 2p. Additionally, the inner circumferential surface 12 of the internal member 10 is typically formed of an elastic material. Because of this, in the specific state, a portion of the internal member 10 deforms to fit the outer diameter of the projection 2p, the portion abutting the outer circumferential surface 2q of the projection 2p. The ventilation component 1a is therefore firmly fixed to the projection 2p.

As shown in FIG. 4, according to the ventilation structure 3, as indicated by a dashed line, a gas passes through the gas-permeable membrane 20 for ventilation between the inner space 2u and the outer space 2v of the housing 2. For example, the space 36 and the ventilation hole 35 are included in the ventilation path for this ventilation.

As shown in FIG. 4, a groove 2m in a ring shape is arranged around the projection 2p of the housing 2. When the ventilation structure 3 is viewed in plan along the axis A, an outer diameter of the groove 2m is greater than an outer diameter of the ventilation component 1a. Because of this, when the ventilation component 1a is fixed to the projection 2p, a portion of the ventilation component 1a is housed in the groove 2m. This configuration can increase the area of a region in which the inner circumferential surface 12 of the internal member 10 and the outer circumferential surface 2q of the projection 2p abut each other and makes it likely that the ventilation component 1a is firmly fixed to the projection 2p. Additionally, an apparent protrusion length of the ventilation component 1a from the outer surface of the housing 2 can be reduced. In the housing 2, the groove 2m does not need to be arranged around the projection 2p.

The material of the housing 2 is not limited to a particular material. The material of the housing 2 is, for example, a resin, a metal, or a composite material thereof. The elastic modulus of the material of the projection 2p of the housing 2 is typically greater than the elastic modulus of the elastic material included in the internal member 10. Examples of the housing 2 include housings of in-vehicle electrical components such as lamps, inverters, converters, electronic control units (ECUs), battery packs, radars, and cameras. The housing 2 may be a housing of a variety of electronic devices for home use, medical use, office use, etc.

The ventilation component 1a can be modified in various respects. For example, the ventilation component 1a may be modified to a ventilation component 1b shown in FIGS. 5A and 5B. The ventilation component 1b is configured in the same manner as the ventilation component 1a, unless otherwise described. The components of the ventilation component 1b that are the same as or correspond to those of the ventilation component 1a are denoted by the same reference characters, and detailed descriptions of such components are omitted. The description given for the ventilation component 1a can apply to the ventilation component 1b, unless there is technical inconsistency.

Figure 5A:
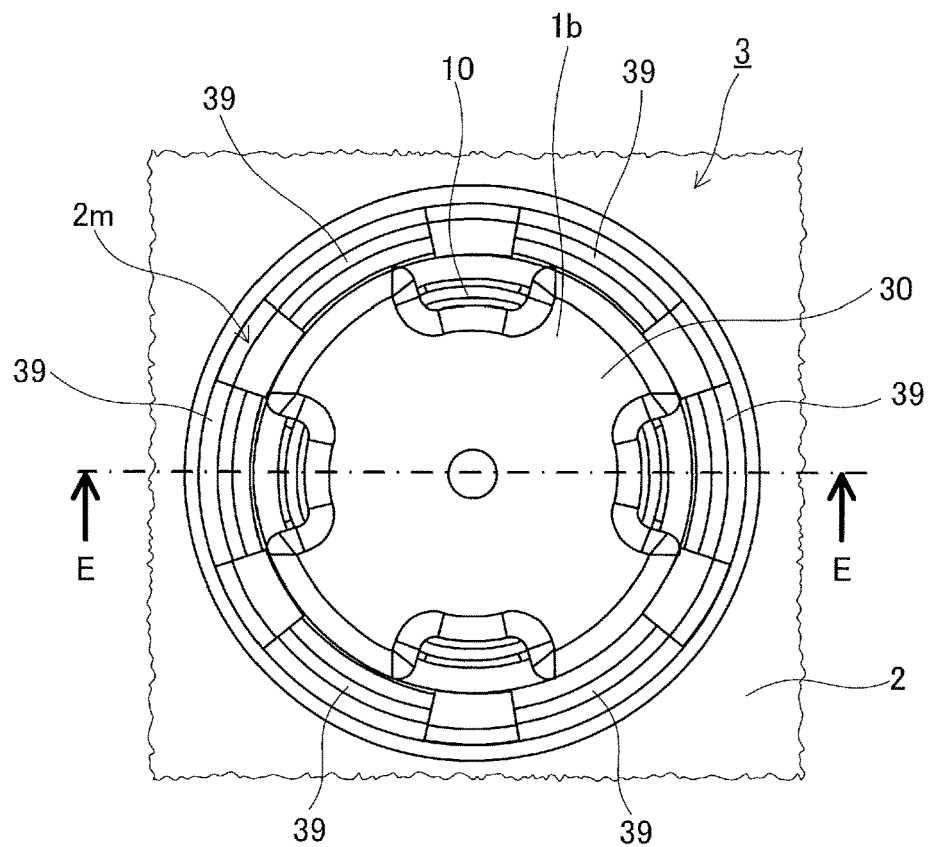
FIG. 5A is a plan view showing another example of the ventilation component according to the present invention.

As shown in FIG. 5A, in the ventilation component 1b, the external member 30 has a locking portion 39 on the outer circumferential surface of the closed tubular structure of the external member 30. The locking portion 39 is configured to be locked to the housing 2 in a state where the ventilation component 1b is fixed to the projection 2p. According to this configuration, for example, vibration of the housing 2 is unlikely to cause detachment of the ventilation component 1b from the housing 2.

As shown in FIG. 5A, in the ventilation component 1b, the external member 30 has, for example, a plurality of the locking portions 39 around the axis A of the ventilation component 1b. The plurality of locking portions 39 are, for example, placed around the axis A at regular intervals. The locking portion 39 is arranged, for example, in the shape of a strip oblique to the axis A. The locking portion 39 extends outward in the direction perpendicular to the axis A and toward the bottom wall 32 from an edge of the opening of the closed tubular structure of the external member 30 in an axial direction of the ventilation component 1b.

Figure 5B:
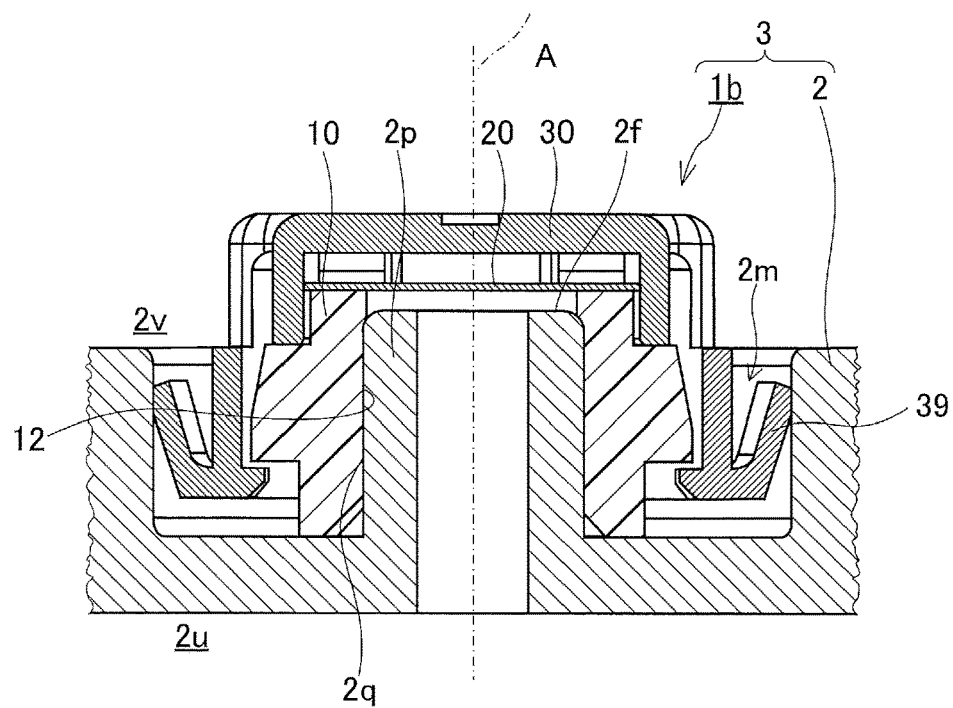
FIG. 5B is a cross-sectional view of the ventilation component along a line E-E of FIG. 5A.

As shown in FIG. 5B, in the ventilation structure 3 in which the ventilation component 1b is fixed to the projection 2p, the locking portion 39 is pressed against a portion forming an outer side of the groove 2m on the outer surface of the housing 2 to warp toward the axis A. The locking portion 39 is deformed in such a manner to be locked to the housing 2.

The invention claimed is:

1. A ventilation component comprising:
    an internal member including an elastomer, having an open tubular structure, and having a protruding portion protruding outward from an outer circumferential surface of the open tubular structure;
    a gas-permeable membrane covering one opening of the internal member; and
    an external member having a closed tubular structure and having a hooking portion on an inner circumferential surface of the closed tubular structure, the hooking portion hooking the protruding portion, wherein
    the internal member is fixed to the external member in a state where the internal member is inserted inside the external member and the external member hooks the protruding portion by the hooking portion,
    the ventilation component is capable of being fixed to a projection of a housing in a state where the projection is inserted inside the internal member through a second opening of the internal member and an inner circumferential surface of the internal member and an outer circumferential surface of the projection abut each other, the projection tubularly protruding from an outer surface of the housing toward an edge of a ventilation opening allowing communication between an inner space and an outer space of the housing,
    in a state where the ventilation component is fixed to the projection, a gas is capable of passing through the gas-permeable membrane for ventilation between the inner space and the outer space of the housing,
    when the internal member and the external member are viewed in plan along an axis of the ventilation component, an outer diameter $O_B$ of the protruding portion, an inner diameter $I_H$ of the hooking portion, and an inner diameter $O_O$ of a portion of the external member satisfy a requirement $I_H<O_B<O_O$, the portion facing the protruding portion,
    the protruding portion extends along an entire outer circumference of the open tubular structure, and
    the ventilation component allows air to pass from the outer space of the housing to the inner space of the housing in the state where the ventilation component is fixed to the projection.

2. The ventilation component according to claim 1, wherein a difference $O_O-O_B$ determined by subtracting the outer diameter $O_B$ from the inner diameter $O_O$ is 0.1 mm or more and 1.0 mm or less.

3. The ventilation component according to claim 1, wherein
    the external member includes a ventilation hole formed to penetrate at least one of a side wall of the closed tubular structure and a bottom wall of the closed tubular structure and arranged closer to the bottom wall than the protruding portion in an axial direction of the ventilation component.

4. The ventilation component according to claim 3, wherein the ventilation hole is arranged such that at least one of the internal member and the gas-permeable membrane is not visible along a direct line of sight from an outer opening of the ventilation hole.

5. The ventilation component according to claim 1, wherein
the external member has a locking portion on an outer circumferential surface of the closed tubular structure, and
the locking portion is configured to be locked to the housing in a state where the ventilation component is fixed to the projection.

* * * * *